(12) United States Patent
Semenov et al.

(10) Patent No.: US 10,868,526 B2
(45) Date of Patent: Dec. 15, 2020

(54) SYNCHRONIZER WITH CONTROLLED METASTABILITY CHARACTERISTICS

(71) Applicant: NXP USA, Inc., Austin, TX (US)

(72) Inventors: Mikhail Yurievich Semenov, Moscow (RU); Victor Mikhailovich Mikhailov, Moscow (RU); Sergei Victorovich Somov, Moscow (RU); Denis Borisovich Malashevich, Moscow (RU); Viacheslav Sergeyevich Kalashnikov, Moscow (RU)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/458,239

(22) Filed: Jul. 1, 2019

(65) Prior Publication Data

US 2020/0195238 A1  Jun. 18, 2020

(30) Foreign Application Priority Data

Dec. 14, 2018  (RU) ................................ 2018144431

(51) Int. Cl.
*H03K 3/356* (2006.01)
*H03K 3/037* (2006.01)
*H03K 19/003* (2006.01)

(52) U.S. Cl.
CPC ..... *H03K 3/356173* (2013.01); *H03K 3/0372* (2013.01); *H03K 3/0375* (2013.01); *H03K 19/003* (2013.01)

(58) Field of Classification Search
None
See application file for complete search history.

(56) References Cited

U.S. PATENT DOCUMENTS

| 6,512,406 | B1 | 1/2003 | Dike |
| 6,531,905 | B1 | 3/2003 | Wang |
| 7,965,119 | B2 | 6/2011 | Priel et al. |
| 8,904,336 | B1 | 12/2014 | Pasternak et al. |
| 2007/0280012 | A1* | 12/2007 | Obayashi ............. G11C 17/165 365/200 |

(Continued)

OTHER PUBLICATIONS

Author Anonymous, "Back Biased Flip-Flop to Improve Metastability Resolution Constant", IP.com Electronic Publication, XP013160568, Jan. 8, 2014.

(Continued)

*Primary Examiner* — Cassandra F Cox

(57) ABSTRACT

Synchronizer circuits having controllable metastability are provided, one of which includes: a first flip-flop circuit comprising a first master latch connected in series with a first slave latch; and a second flip-flop circuit comprising a second master latch connected in series with a second slave latch, wherein an output of the first flip-flop circuit is connected to an input of the second flip-flop circuit, at least a portion of the first flip-flop circuit is implemented in a first PWell isolated by an underlying a deep isolation NWell, at least a portion of the first flip-flop circuit is implemented in a first NWell that electrically contacts the deep isolation NWell, the first NWell is connected to a first bias voltage that is less than a positive power supply voltage, and the first PWell is connected to a second bias voltage that is greater than a negative power supply voltage.

20 Claims, 8 Drawing Sheets

(56) References Cited

U.S. PATENT DOCUMENTS

| | | | |
|---|---|---|---|
| 2013/0135017 A1* | 5/2013 | Jones | H03K 3/356173 327/142 |
| 2013/0185692 A1* | 7/2013 | Kim | G06F 30/3312 716/134 |
| 2013/0249612 A1* | 9/2013 | Zerbe | H03L 7/099 327/161 |
| 2015/0222266 A1 | 8/2015 | Lin et al. | |
| 2018/0247902 A1* | 8/2018 | Darmon | G06F 30/39 |

OTHER PUBLICATIONS

Beer, S., "Eleven Ways to Boost Your Synchronization", IEEE Transactions on Very Large Scale Integration (VLSI) Systems, vol. 23, No. 6, Jun. 2015.

Chen, D., "A Comprehensive Approach to Modeling, Characterizing and Optimizing for Metastability in FPGAs", Field Programmable Gate Arrays, ACM, Feb. 21-23, 2010.

Li, D., "Design and Analysis of Metastable-Hardened Flip-Flops in Sub-Threshold Regions", Internal Symposium on Low Power Electronics and Design (ISLPED), Aug. 1, 2011.

\* cited by examiner

SYNCHRONIZER WITH CONTROLLED METASTABILITY CHARACTERISTICS

BACKGROUND

Field

This disclosure relates generally to synchronizers, and more specifically, to circuits handling metastability in synchronizers.

Related Art

Synchronized devices sample or receive data by sampling the data at sampling points that are usually defined by a clock signal. In order to sample the data correctly, timing constraints (such as a setup period and hold period) are imposed, which require the input to be held stable before and after a clock edge. These timing constraints define the timing difference between data signal transitions and clock signal transitions. Basically, sampling requires that there is a minimal timing difference between such transitions.

Synchronizers are commonly used for interfacing different circuits that reside in clock domains that are mutually asynchronous. Typically, a synchronizer receives a data signal from an asynchronous circuit that is not clocked at all, or clocked by another clock. The asynchronicity complicates the imposition of the above timing constraints. As a result, the synchronizer may sample the data signal while the data signal is changing or not properly defined, also referred to as being in a metastable state. The synchronizer will eventually converge into a stable position, but the convergence period is not indeterminable.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted.

Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Overview

Currently, most systems-on-chip (SoC) have multiple domains with asynchronous signals. Such signals need to be synchronized to the main system clock. If an asynchronous data input comes simultaneously with a clock signal, then flip-flop circuitry might enter a metastable state. Synchronizers are special cells used for data synchronization. Often, the number of synchronizers in an SoC may number in the thousands. Traditionally, synchronizers are targeted flip-flops, or chains of two or more serially connected flip-flops.

Flip-flops in synchronizers need to be specially optimized to minimize a key parameter, Tau, which is the metastability resolving timing constant. Probability analysis is also used to estimate if a flip-flop is entering the metastable state. Metastability occurrences can be predicted by using the Mean Time Between Failures (MTBF) parameter, which is defined for a 2-flip-flop synchronizer as:

$$MTBF = \frac{e^{Ts/Tau}}{Tw \cdot Fc \cdot Fd}$$

where

Ts is settling time, or time available for metastability resolving;

Tau is the metastability resolving timing constant;

Tw is the metastability window, during which metastability may happen;

Fc is the system clock frequency of a synchronizer; and

Fd is the input asynchronous data frequency.

For a 2-flip-flop synchronizer, Tau usually corresponds to one clock synchronization period. Some of the parameters shown in the MTBF equation (e.g., clock frequency, input data frequency) depend on concrete system requirements or applications. Therefore, MTBF requirements cannot be met simply by varying these parameters.

Figure 1:
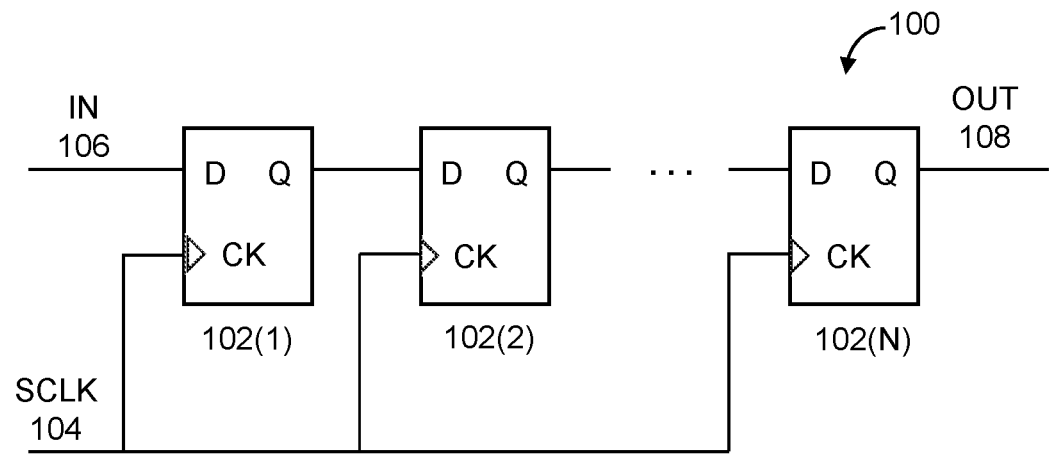
FIG. 1 illustrates a circuit schematic depicting an example generic synchronizer.

An example circuit schematic of a generic synchronizer 100 is provided in FIG. 1, where the number of flip-flops in the synchronizer 100 depends on the required MTBF value. Synchronizer 100 may be built from conventional flip-flops from a standard cell library, such as D-type flip-flops, but such conventional flip-flops have quite high Tau values. Synchronizer 100 includes an N number of flip-flops 102 (1)-(N), such as D flip-flops that have a data input D, a data output Q, and a clock input CK. The flip-flops 102(1)-(N) receive a system clock signal SCLK 104 having a frequency Fc. The flip-flops are serially-connected (e.g., each output Q is connected to input D of a next flip-flop), where the first flip-flop 102(1) receives an input signal IN 106 of asynchronous data having a frequency Fd, and the last flip-flop 102(N) outputs an output signal OUT 108 of synchronous data.

In order to reach the required MTBF value, a large number of stages are needed in the synchronizer, where the timing slack on each additional stage connection is added to the settling time. Some conventional synchronizer solutions attempt to quickly resolve metastability by implementing flip-flops with altered circuit structure, such as duplicative parallel-connected flip-flops to quickly stabilize the output, or flip-flop circuitry that forces a switching point to reach a stable output, or flip-flop circuitry that includes lightly loaded cross-coupled transistors that amplify a voltage difference between two outputs to quickly stabilize the outputs, or flip-flop circuitry that includes multiple interconnected loops of cross-coupled inverters that provide a metastable state skewed toward different stable states in respective loops. However, such solutions are static or hard-wired solutions that do not provide adjustable control over Tau values. Further, while Tau may be determined through testing, there is no conventional means for controlling Tau during operation of a synchronizer.

Additionally, many SoC technologies support different voltage threshold devices, such as low voltage threshold (LVT), regular or standard voltage threshold (RVT or SVT), and high voltage threshold (HVT). Synchronizers implemented in LVT technology often provide lower Tau values that correspond to a better MTBF. However, if a project is implemented in RVT or HVT technology, then LVT synchronizers may add one or several extra masks, which in some cases would not be acceptable due to wafer cost increase. In such cases, the project would use RVT or HVT synchronizers that would include more stages (or serially-connected flip-flops) to meet MTBF requirements. In turn, this results in area and power increase for a synchronizer, and correspondingly for the entire chip, especially if the number of synchronizers is significant. Further, LVT-only synchronizers also have problems related to higher power and leakage.

To minimize probability of the metastability state and improve robustness of a synchronizer, the present disclosure provides a synchronizer solution that minimizes Tau timing constant by optimizing flip-flop circuitry used in the synchronizer. The optimization schemes discussed herein controls and manages the Tau parameter without increasing the number of stages in the synchronizer and without altering system requirements. Since the metastability may be well-controlled by the techniques provided herein, the synchronizers discussed herein need only 2 flip-flops. However, other embodiments may include additional conventional serially connected flip-flops after the second FF.

In some embodiments, NWell and PWell forward biasing techniques are used to optimize the flip-flop circuitry. For example, circuitry of a first flip-flop of a synchronizer may be implemented in NWell and PWell regions that are isolated by a deep isolation NWell, where the NWell and PWell regions are biased in such a way as to forward bias the PN junctions of the circuitry implemented in the NWell and PWell regions, which are also referred to herein as forward biased NWell and PWell regions. This approach reduces the Tau value and correspondingly increases MTBF. The entire first flip-flop may be implemented in the forward biased NWell and PWell regions or only the timing-critical parts of the first flip-flop, such as the master latch or feedback path, may be implemented in the forward biased NWell and PWell regions to minimize Tau. Other parts of the synchronizer may remain as conventional cells, such as flip-flops subsequent to the first flip-flop, that are conventionally biased. Area penalty may be reduced in multi-bit synchronizer implementations, where circuitry of the first flip-flop in each bit synchronizer may be grouped together in the forward biased NWell and PWell regions.

In some embodiments, low voltage threshold (LVT) technology is used to optimize the flip-flop circuitry. For example, circuitry of a first flip-flop of a synchronizer may be formed using LVT technology, while other parts of the synchronizer may be formed using regular voltage threshold (RVT) technology. The timing-critical parts of the flip-flop may be formed using LVT technology, such as the master latch or feedback path, to minimize Tau. Other parts of the synchronizer may remain as conventional cells implemented with RVT technology. This synchronizer solution also reduces power and leakage in synchronizers when using mixed voltage threshold architecture.

Example Embodiments

Figure 2A:
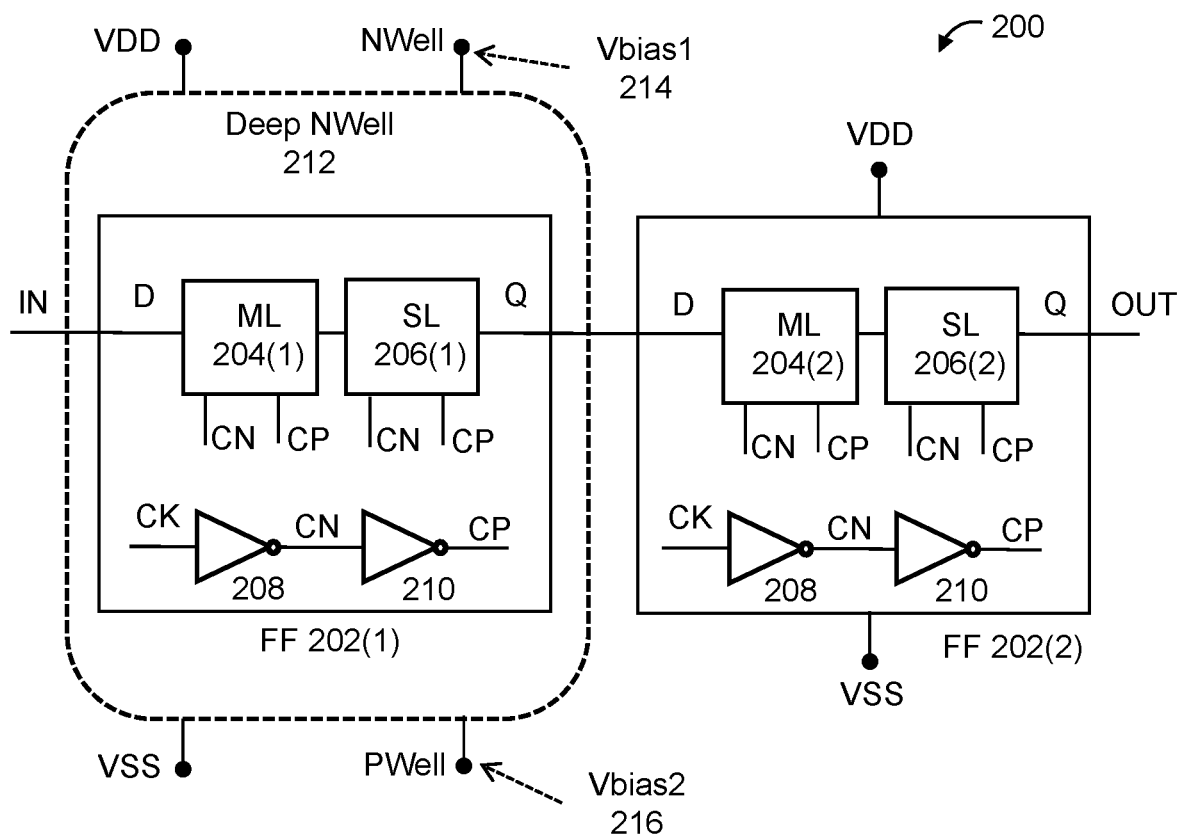
FIGS. 2A, 2B, and 2C illustrate example circuit schematics depicting an example optimized synchronizer implementing forward biasing techniques for metastability control, according to some embodiments of the present disclosure.

FIG. 2A is a circuit schematic showing an optimized synchronizer 200 that is implemented with two flip-flops (FF) 202(1)-(2), which may be any type of flip-flop, such as D-type or SR-type. In the embodiments shown, each FF 202 is implemented with a master latch 204 and a slave latch 206. Inputs of the master latches 204(1)-(2) are labeled D, outputs of the master latches 204(1)-(2) are respectively connected to inputs of slave latches 206(1)-(2), and outputs of slave latches 206(1)-(2) are labeled Q. The two FFs 202(1)-(2) are serially connected, where the output of slave latch 206(1) is connected to the input of master latch 204(2). The input signal IN of the synchronizer 200 is a data signal from a first clock domain, and the output signal OUT of the synchronizer 200 is a data signal synchronized to a second clock domain, where the first and second clock domains do not use the same clock signal. For example, the first and second clock domains may use clock signals that have different frequencies, or the first clock domain may be an asynchronous clock domain. In other embodiments, additional FFs may be serially connected subsequent to the second FF 202(2), although 2 FFs are sufficient for meeting the required Tau value, according to the present disclosure.

Each master latch 204(1)-(2) and each slave latch 206(1)-(2) receive clock signals CN and CP, which are generated based on a clock signal CK of the second clock domain. For example, a clock chain of two serially-connected inverters is shown in each FF 202(1)-(2). Clock signal CK is provided to inverter 208 to produce CN, which in turn is provided to inverter 210 to produce CP. Each master latch 204(1)-(2) and each slave latch 206(1)-(2) may be gated using the clock signals CN and CP to synchronize the input data signal with the clock domain that uses clock signal CK.

Figure 2B:
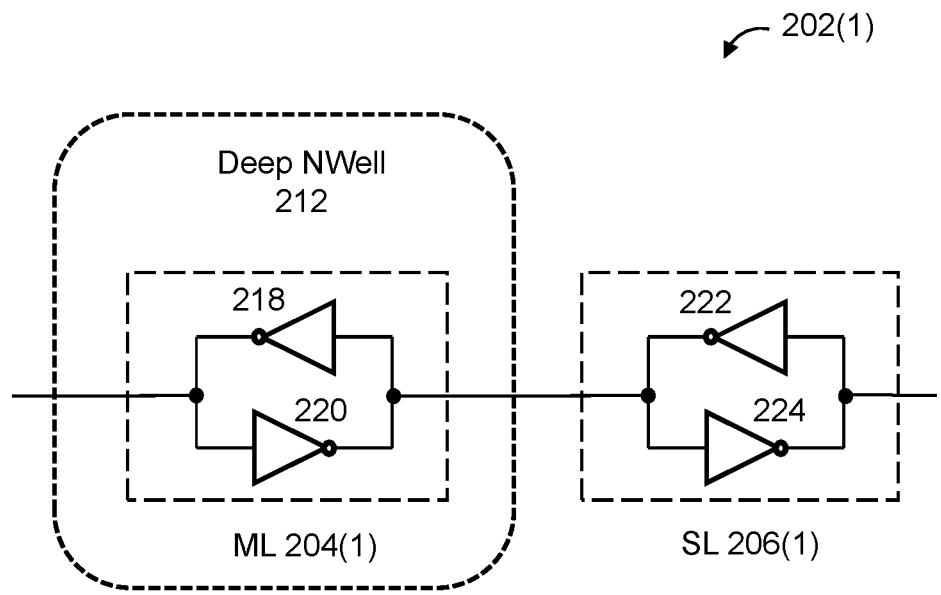

The function of each master latch 204(1)-(2) and each slave latch 206(1)-(2) may be represented as a simple cross-coupled inverter pair like that shown in FIG. 2B. For example in FIG. 2B, master latch 204(1) includes an input path represented by input inverter 220 and a feedback path represented by feedback inverter 218 connected in a loop, and slave latch 206(1) includes an input path represented by input inverter 224 and a feedback path represented by feedback inverter 222 connected in a loop, where each loop stores a data value. The function of each master latch 204(1)-(2) and each slave latch 206(1)-(2) may be implemented by any number of circuit arrangements that store a data value, and is not limited to only a simple cross-coupled inverter pair.

Besides the master latches 204(1)-(2) and the slave latches 206(1)-(2), the circuitry of each FF 202(1) and FF 202(2) may also include additional components, examples of which include but are not limited to: a clock chain (such as one or two inverters to form direct or inverted clock signals, which may also include more complex circuitry in other embodiments), an input scan multiplexor (if the FF is scannable, a multiplexor may be included to scan among input lines and provide a single output line, where the multiplexor is a combinational logic circuitry), a set/reset chain (such as one or more inverters to form direct or inverted set signals, reset signals, or both), and a scan enable chain (such as an inverter to form direct or inverted scan enable signals).

The circuitry of the FFs 202(1)-(2) may be implemented with transistors, such as n-type or p-type metal-oxide-semiconductor (MOS) transistors. For example, the latches 204(1)-(2) and 206(1)-(2) may be implemented using CMOS (complementary metal-oxide-semiconductor) technology which implements both n-type (NMOS) transistors and p-type (PMOS) transistors. As used herein, "n-type" and "p-type" generally indicates the majority carrier of a semiconductor region, where n-type indicates a region with a greater concentration of electron carriers than hole carriers (e.g., the region has a negative charge due to excess electrons), and p-type indicates a region with a greater concentration of hole carriers than electron carriers (e.g., the region has a positive charge due to excess holes). For example, when used to describe transistors, n-type and p-type indicates the majority carrier of the diffusion regions of the transistor. The transistors of FF 202(1) and 202(2) may be connected between a positive power supply voltage rail, such as VDD, and a negative power supply voltage rail, such as VSS or ground.

Circuitry of a flip-flop is implemented in a semiconductor substrate, such as a p-type substrate. NWell regions, which are n-type doped areas within the p-type substrate, are used to implement p-type circuitry (e.g., PMOS). PWell regions, which are p-type doped areas within the p-type substrate, are used to implement n-type circuitry (e.g., NMOS). PWell regions may be a portion of the p-type substrate itself, or may be a p-type doped area that is isolated from the p-type substrate by a deep NWell that underlies the PWell region. The isolated PWell region may also be laterally surrounded by an NWell "fence" or "wall" that makes electrical contact with the underlying PWell region. Conventionally, the p-type substrate is biased at the negative power supply voltage VSS, and the NWell is biased at the positive power supply voltage VDD.

According to the present disclosure, Tau may be reduced by applying NWell and PWell forward biasing techniques to the circuitry of the first FF 202(1). At least a portion of the circuitry of the first FF 202(1) (also referred to as the first FF circuitry) is implemented in an NWell. Rather than biasing the NWell at VDD, the NWell is biased using a first voltage Vbias1 214 that is less than VDD. Another portion of the first FF circuitry is also implemented in a PWell. In order to achieve forward biasing of the PWell, the PWell is isolated using a deep NWell 212 formed underneath the PWell and an NWell that laterally surrounds the PWell. The laterally surrounding NWell may be part of the same NWell that contains a portion of the first FF circuitry or may be a different NWell. Rather than biasing the PWell at VSS, the PWell is biased using a second voltage Vbias2 216 that is greater than VSS. The deep NWell 212 may also extend underneath the NWell that contains at least a portion of the first FF circuitry. By contrast, the circuitry of the second FF 202(2) is implemented in a conventionally biased NWell (which is separate and distinct from the forward biased NWell) and a conventionally biased PWell (which is separate and distinct from the forward biased PWell, and may be a portion of the p-type substrate itself), as indicated by the second FF 202(2) remaining outside of the deep NWell 212.

In some embodiments, the first FF circuitry implemented in the forward biased NWell and PWell regions includes the master latch 204(1) and the slave latch 206(1), and optionally includes additional components, such as the clock chain described above. For example, in the embodiment shown in FIG. 2A, the entirety of the first FF circuitry (including latches 204(1) and 206(1), and the clock chain) is implemented in the forward biased NWell and PWell regions, as indicated by the deep NWell 212 underlying the entire first FF 202(1). It is noted that a single bit synchronizer like that shown in FIG. 2A does incur an area penalty due to implementing the deep NWell 212 in the synchronizer 200. However, this area penalty may be mitigated by implementing several single bit synchronizers having first FF circuitry implemented in the deep NWell 212, where the area penalty is shared between the synchronizers, as further discussed below in connection with FIG. 5.

In some embodiments, the first FF circuitry implemented in the forward biased NWell and PWell regions includes timing-critical paths. For example, another embodiment of synchronizer 200 may be achieved by replacing the first FF 202(1) shown in FIG. 2A with the embodiment of FF 202(1) shown in FIG. 2B, where only the master latch 204(1) of FF 202(1) is implemented in the forward biased NWell and PWell regions, as indicated by the deep NWell 212 underlying master latch 204(1). In such embodiments, the slave latch 206(1) is implemented in conventionally biased NWell and PWell regions, along with the second FF 202(2). As another example, another embodiment of synchronizer 200 may be achieved by replacing the first FF 202(1) shown in FIG. 2A with the embodiment of FF 202(1) shown in FIG. 2C, where only the feedback path of FF 202(1) is implemented in the forward biased NWell and PWell regions, as indicated by the deep NWell 212 underlying feedback inverter 218. In such embodiments, the input path is implemented in conventionally biased NWell and PWell regions (along with the slave latch 206(1) and second FF 202(2)), as indicated by the input inverter 220 remaining outside of deep NWell 212.

Figure 2C:
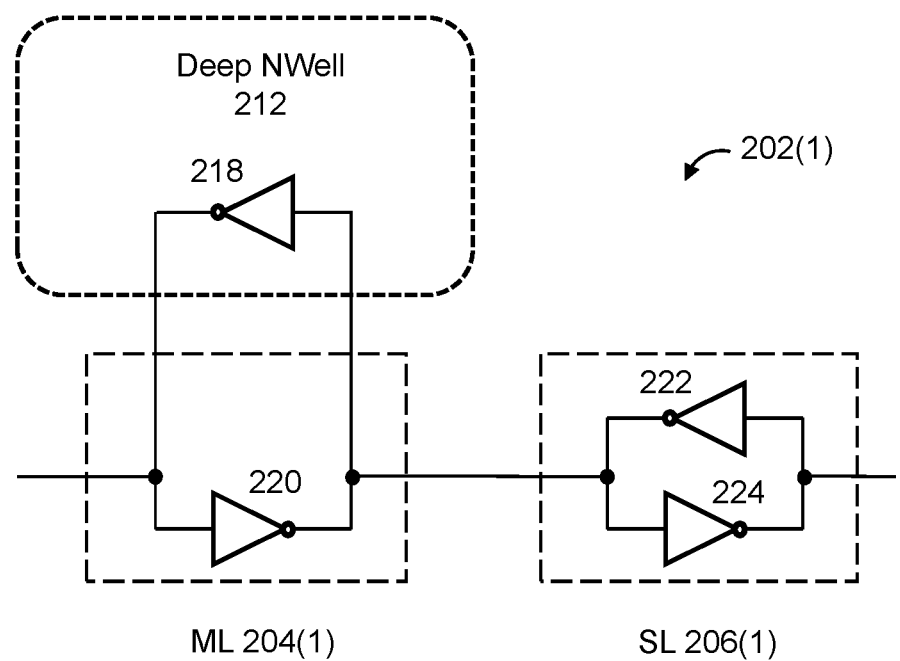

The embodiments shown in FIGS. 2B and 2C are also beneficial for reducing the leakage current of the synchronizer since only the timing-critical parts are implemented in forward biased NWell and PWell regions. The embodiments shown in FIGS. 2B and 2C are also beneficial for reducing the number of components implemented in the deep NWell 212, which somewhat reduces the area penalty caused by implementing the deep NWell 212 in the single bit synchronizer design. The embodiments shown in FIGS. 2B and 2C become more beneficial when used to implement several bit synchronizers having the timing-critical parts of the first FF circuitry implementing in the deep NWell 212, where the area penalty is shared between the synchronizer, as further discussed below in connection with FIG. 5. The forward biased NWell and PWell regions and the deep NWell 212 are discussed in further detail in connection with FIG. 3.

Figure 3:
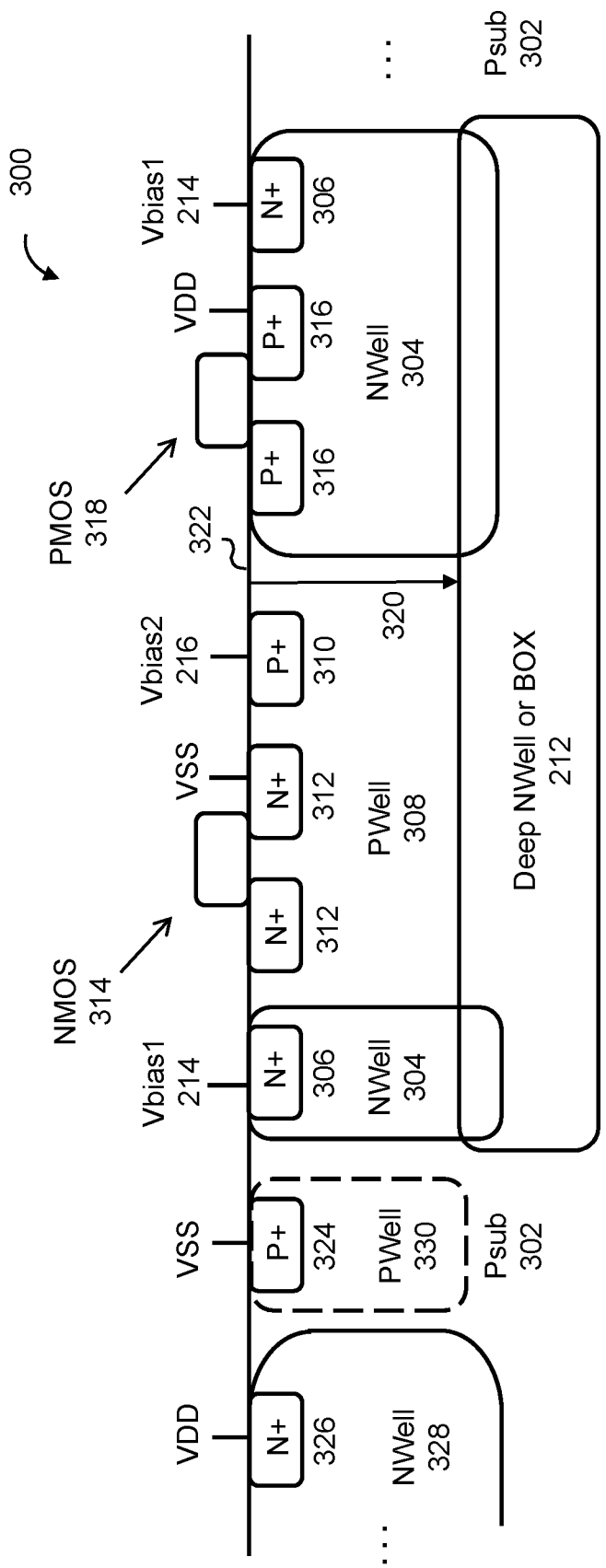
FIGS. 3 and 4 illustrate example circuitry component layouts of an optimized synchronizer, according to some embodiments of the present disclosure.

FIG. 3 shows a cross-sectional view of an example circuitry component layout 300 of an optimized synchronizer, which may be implemented using any of the embodiments described above in connection with FIG. 2A, 2B, or 2C. Layout 300 is implemented in a p-type substrate 302, labeled as Psub 302. A deep NWell 212 is formed at and below some depth 320 from a surface 322 of the Psub 302. Deep NWell 212 is an n-doped region that extends laterally across the areas in which the NWell and PWell are formed. In some embodiments, the deep NWell 212 may be some other isolation layer, such as a buried oxide (BOX) layer or other suitable insulator layer formed for a silicon on insulator (SOI) implementation.

PWell 308 is a p-doped region formed within depth 320 from surface 322 of Psub 302. PWell 308 is also laterally surrounded by NWell 304, which is an n-doped region formed between surface 322 and deep NWell 212, where NWell 304 and deep NWell 212 make electrical contact. Generally, NWell 304 and PWell 308 are more heavily doped than Psub 302 (e.g., NWell 304 and PWell 308 have a greater majority carrier concentration than that of Psub 302), and deep NWell 212 is more heavily doped than PWell 308 and NWell 304 (e.g., deep NWell 212 has a greater majority carrier concentration than that of PWell 308 and NWell 304).

In the embodiments discussed herein, PWell 308 and NWell 304 each contain at least a portion of the circuitry of the first FF 202(1) of the optimized synchronizer. N+ diffusion regions 312 are formed at the surface 322 within PWell 308 to form part of n-type circuitry of the first FF 202(1), such as an NMOS transistor 314. P+ diffusion regions 316 are formed at the surface 322 within NWell 304 to form part of p-type circuitry of the first FF 202(1), such as a PMOS transistor 318. Depending on the circuitry implementation, NMOS 314 may have a diffusion region 312 connected to VSS and PMOS 318 may have a diffusion region 316 connected to VDD.

N+ diffusion regions are also formed at the surface 322 within NWell 304 to form ohmic connections 306 to NWell 304 (also referred to as NWell contacts 306), which are used to bias NWell 308. Similarly, P+ diffusion regions are also formed at the surface 322 within PWell 308 to form ohmic connections 310 to PWell 308 (also referred to as PWell contacts 310), which are used to bias PWell 308.

For comparison, the circuitry of the second FF 202(2) is implemented in other n-doped and p-doped regions in Psub 302, such as in NWell 328 and PWell 330 that are laterally spaced apart from deep NWell 212 and distinct from NWell 304 and PWell 308. NWell 328 does not make electrical contact with deep NWell 212, and PWell 330 is not isolated by deep NWell 212. NWell 328 has an N+ diffusion region formed at the surface 322 that forms a contact 326 used to conventionally bias NWell 328, which is connected to VDD. PWell 330 is shown in dashed outline, which indicates PWell 330 may be a portion of Psub 302 itself, having the same majority carrier concentration as Psub 302, or PWell 330 may be some other p-doped region formed in Psub 302, having a majority carrier concentration greater than Psub 302. PWell 330 may also have a P+ diffusion region formed at the surface 322 that forms a contact 324 used to conventionally bias PWell 330 and Psub 302 (since they are electrically connected), where contact 324 is connected to VSS. In this manner, different biasing schemes may be applied to the various n-doped and p-doped regions of the Psub 302, including both conventional biasing schemes and the presently disclosed forward biasing scheme.

Conventionally, NWell 304 would also be biased with VDD and PWell 308 would also be biased with VSS. However, in the embodiments discussed herein, NWell 304 and PWell 308 are biased such that any PN junctions formed in NWell 304 and PWell 308 are forward biased. As used herein, a PN junction is formed between an n-doped region and a p-doped region. As also used herein, forward biasing of a PN junction indicates that a more positive voltage (e.g., larger positive voltage) is applied to the p-doped region and a more negative voltage (e.g., smaller positive voltage) is applied to the n-doped region.

NWell 304 is biased using a first voltage Vbias1 214 that is less than VDD by some forward biasing voltage VFWD1, or Vbias1=VDD−VFWD1. Generally, the forwarding biasing voltage VFWD1 may have some magnitude from 0 to an opening threshold voltage of the PN junction being forward biased. For example, forward biasing voltage VFWD1 may fall in a range of 0.1V to 0.5V. The PN junction formed between P+ region 316 and NWell 304 is forward biased by tying P+ region 316 to VDD and connecting NWell 304 (through NWell contact 306) to Vbias1, which is less than VDD.

Similarly, PWell 308 is biased using a second voltage Vbias2 216 that is greater than VSS by some forward biasing voltage VFWD2, or Vbias2=VSS+VFWD2. Similarly, the forwarding biasing voltage VFWD2 generally has a magnitude from 0 to an opening threshold voltage of the PN junction being forward biased. For example, forward biasing voltage VFWD2 may also fall in a range of 0.1V to 0.5V. The PN junction formed between N+ region 312 and PWell 308 is forward biased by tying N+ region 312 to VSS and connecting PWell 308 (through PWell contact 310) to Vbias2, which is greater than VSS.

Figure 9:
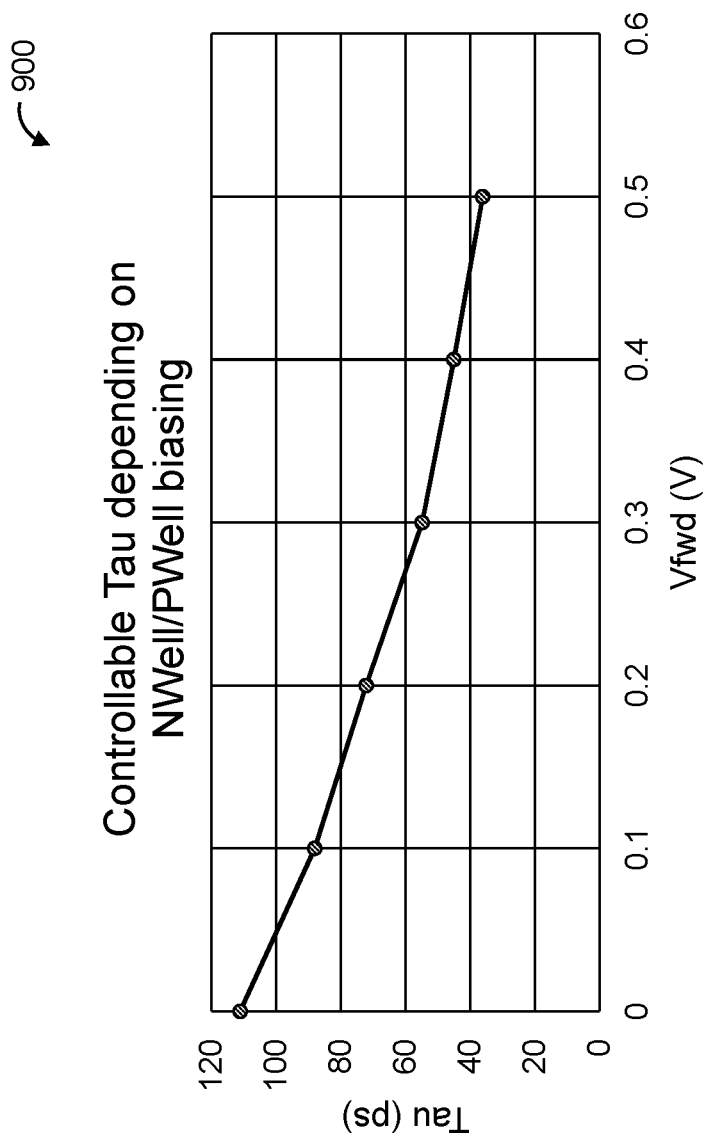
FIG. 9 illustrates a Tau curve based on forward biasing techniques implemented in an optimized synchronizer, according to some embodiments of the present disclosure.

As the values of VFWD1 and VFWD2 are adjusted, the Tau value of the optimized synchronizer is also adjusted. For example, FIG. 9 shows how Tau may be controlled by adjusting a forward biasing voltage Vfwd, which may be used to either forward bias the NWell 304 (e.g., subtracted from VDD) or the PWell 308 (e.g., added to VSS). As the magnitude of Vfwd is increased from 0V to 0.5V, the value of Tau is decreased. In a synchronizer without forward biasing (e.g., Vfwd=0V), Tau may be 110 ps or larger (e.g., some conventional non-optimized synchronizers may have a Tau value on the order of hundreds of picoseconds, such as 300 or 400 ps). By forward biasing NWell 304 and PWell 308 using Vfwd up to 0.5V, Tau may be reduced down to 35 ps. For lower system clock frequencies, a smaller forward biasing voltage may be used to reduce Tau to a desired value, which also reduces leakage power in the synchronizer. It is also noted that while a same forward biasing voltage Vfwd may be used to bias both the NWell 304 and the PWell 308 (e.g., VFWD1=VFWD2) in some embodiments, different forward biasing voltages may be used to bias the NWell 304 and PWell 308 (e.g., VFWD1≠VFWD2) in other embodiments. For example, NWell 304 and PWell 308 may be forward biased using VDD−0.3V and VSS+0.3V, or VDD−0.2V and VSS+0.2V, or asymmetrical voltages like VDD−0.3V and VSS+0.5V, depending on the system requirements and the required Tau value. In this manner, the forward biasing voltages may be adjusted to achieve a required Tau value (and corresponding MTBF value) without adding FF stages to the synchronizer or altering the circuit structure of the first FF itself.

Figure 4:
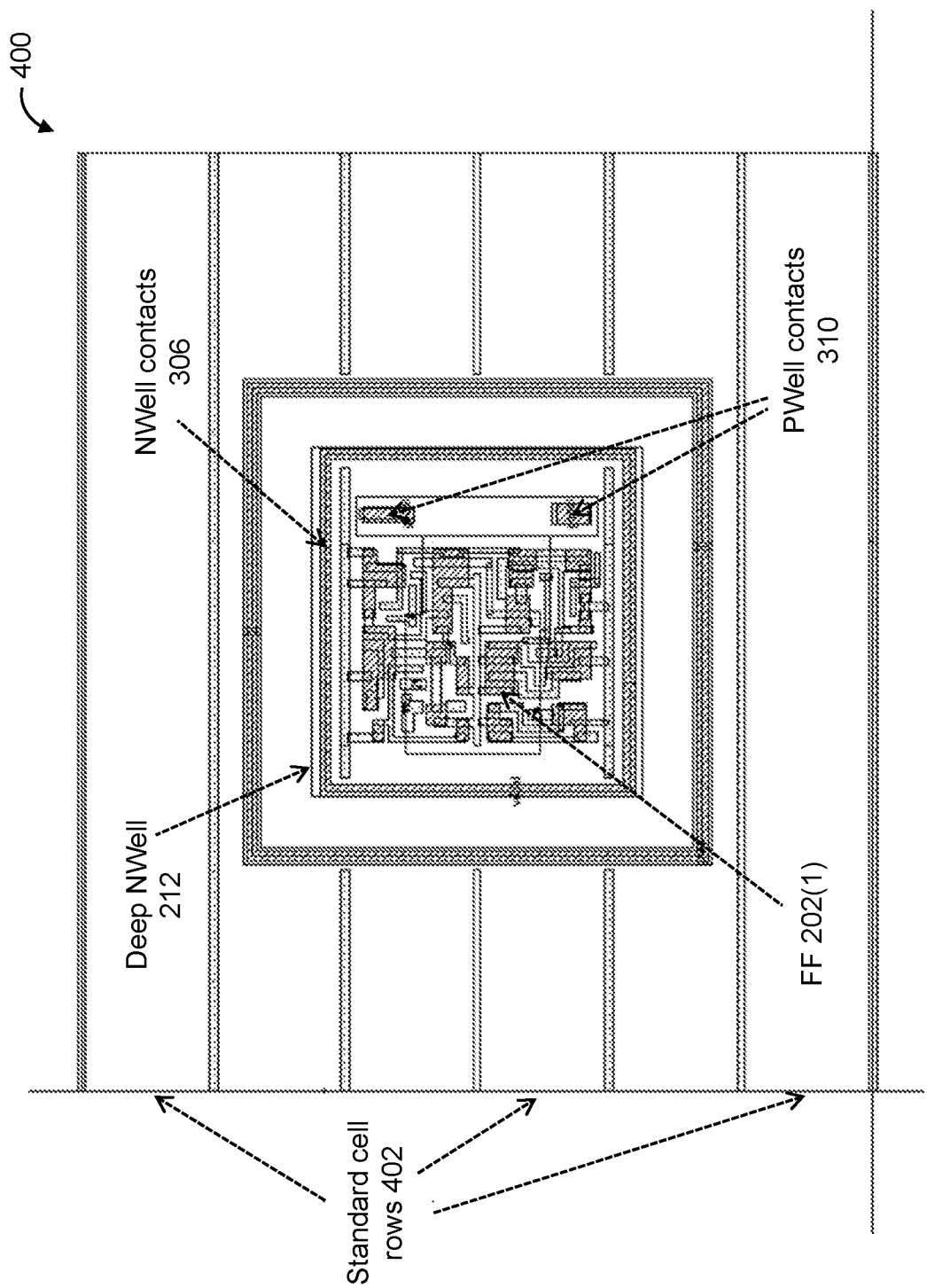

FIG. 4 shows a top-down view of an example circuitry component layout 400 of an optimized synchronizer, which may be implemented using any of the embodiments described above in connection with FIG. 2A, 2B, or 2C. Layout 400 includes standard cell rows 402, which may use standard cells of a standard cell library to implement circuitry of the optimized synchronizer, such as the second FF 202(2). A standard cell may include a group of transistor and interconnect structures that provides some logic function or storage function, which may be used as building blocks for a larger circuit design.

The deep NWell 212 is incorporated within layout 400, where deep NWell 212 underlies both PWell 308 and NWell 304 in the embodiment shown. The area penalty of the deep NWell 212 can be seen as the spatial separation of the deep NWell 212 from the surrounding standard cell layout, due to the requirements of the technology forming the deep NWell 212. The circuitry of first FF 202(1) is implemented within the PWell 308 and NWell 304 that are isolated by deep NWell 212. Several NWell contacts 306 are visible in layout 400, which are connected to a first voltage Vbias1 that is equal to VDD minus a first forward biasing voltage VFWD1. Several PWell contacts 310 are also visible in layout 400, which are connected to a second voltage Vbias2 that is equal to VSS plus a second forward biasing voltage VFWD2. The first and second forward biasing voltages need not be equal. Voltages Vbias1 and Vbias2 may be provided by additional power signal lines respectively connected to NWell contacts 306 and PWell contacts 310.

Figure 5:
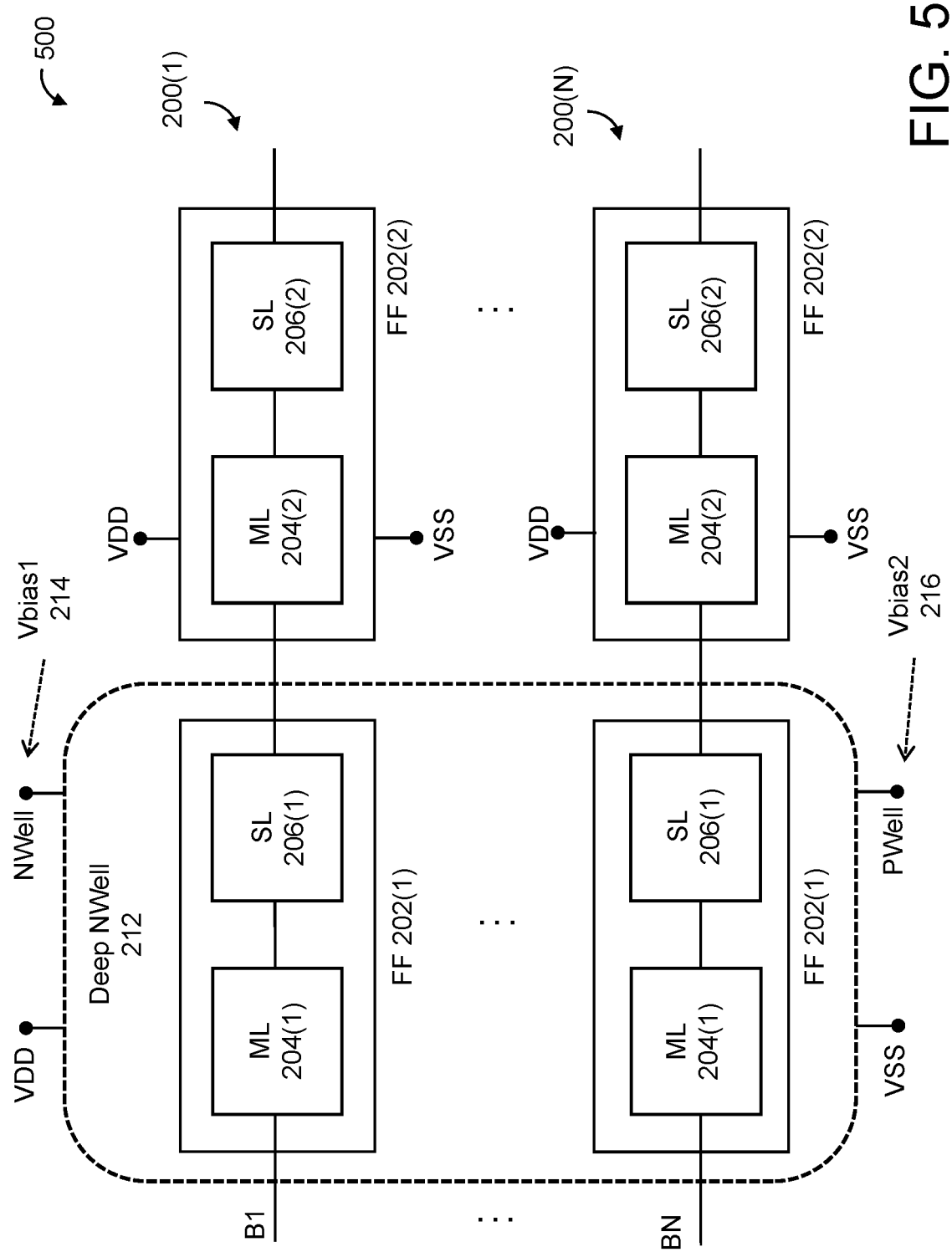
FIG. 5 illustrates a circuit schematic depicting an example optimized multi-bit synchronizer implementing forward biasing techniques for metastability control, according to some embodiments of the present disclosure.

FIG. 5 is a circuit schematic showing an optimized multi-bit synchronizer 500. As discussed above, a single bit synchronizer like that shown in FIG. 2A incurs a large area penalty due to implementing a deep NWell in the synchronizer 200. However, this area penalty may be mitigated by implementing several single bit synchronizers having first FF circuitry implemented in forward biased NWell and PWell regions isolated by the deep NWell 212, where the area penalty is shared between the synchronizers.

Multi-bit synchronizer 500 is implemented using an N number of single bit synchronizers in parallel, where N is an integer greater than 1. In the embodiment shown, multi-bit synchronizer 500 implements N instances of a single bit synchronizer 200 shown in FIG. 2A, which is described above. Each of the synchronizers 200(1)-(N) receives a respective bit B of a multi-bit data signal from a first clock domain, such as a first synchronizer 200(1) receiving B1 and a last synchronizer 200(N) receiving BN. Each of the synchronizers 200(1)-(N) outputs a respective bit of the data signal synchronized to a second clock domain, where the first and second clock domains do not use the same clock signal.

As discussed above, at least a portion of the circuitry of the first FF 202(1) in each synchronizer 200(1)-(N) is implemented in the forward biased NWell and PWell regions that are isolated by the same deep NWell 212. The circuitry of the second FF 202(2) of each synchronizer 200(1)-(N) is implemented in a conventionally biased NWell and Pwell that are not isolated by the deep NWell 212, as indicated by each second FF 202(2) remaining outside of the deep NWell 212. As also discussed above, the NWell is biased with a first voltage Vbias1 that is equal to VDD minus a first forward biasing voltage VFWD1, and the PWell is biased with a second voltage Vbias2 that is equal to VSS plus a second forward biasing voltage VFWD2, which forward biases the circuitry implemented in the NWell and PWell to reduce Tau value. The forward biasing voltages may be adjusted to achieve a required Tau value (and corresponding MTBF value) without adding FF stages to the parallel synchronizers 200(1)-(N) or altering the circuit structure of the first FF itself.

In some embodiments, the first FF circuitry of each synchronizer 200(1)-(N) implemented in the forward biased NWell and PWell regions includes the master latch 204(1) and the slave latch 206(1), and optionally includes additional components, such as the clock chain described above. For example, in the embodiment of multi-bit synchronizer 500 shown in FIG. 5, the entirety of the first FF circuitry is implemented in the forward biased NWell and PWell regions, as indicated by the deep NWell 212 underlying each entire first FF 202(1).

In some embodiments, the first FF circuitry implemented in the forward biased NWell and PWell regions includes timing-critical paths. For example, another embodiment of multi-bit synchronizer 500 may be achieved by replacing each first FF 202(1) shown in FIG. 5 with the embodiment of FF 202(1) shown in FIG. 2B, where only the master latch 204(1) of FF 202(1) is implemented in the forward biased NWell and PWell regions, as indicated by the deep NWell 212 underlying master latch 204(1). In such embodiments, the slave latch 206(1) is implemented in conventionally biased NWell and PWell regions, along with the second FF 202(2). As another example, another embodiment of multi-bit synchronizer 500 may be achieved by replacing each first FF 202(1) shown in FIG. 5 with the embodiment of FF 202(1) shown in FIG. 2C, where only the feedback path of FF 202(1) is implemented in the forward biased NWell and PWell regions, as indicated by the deep NWell 212 underlying feedback inverter 218. In such embodiments, the input path is implemented in conventionally biased NWell and PWell regions (along with the slave latch 206(1) and second FF 202(2)), as indicated by the input inverter 220 remaining outside of deep NWell 212.

As a result, the embodiments of the multi-bit synchronizer 500 described above in connection with FIGS. 5, 2B, and 2C are beneficial since the area penalty incurred by the deep NWell 212 is shared among the N instances of the single bit synchronizers. As also noted above, the embodiments shown in FIGS. 2B and 2C are further beneficial for reducing the leakage current of the multi-bit synchronizer 500 since only the timing-critical parts are implemented in forward biased NWell and PWell regions. The embodiments shown in FIGS. 2B and 2C are also beneficial for reducing the number of components implemented in the deep NWell 212, which scales down the area penalty caused by implementing the deep NWell 212 in the multi-bit synchronizer design.

Figure 6:
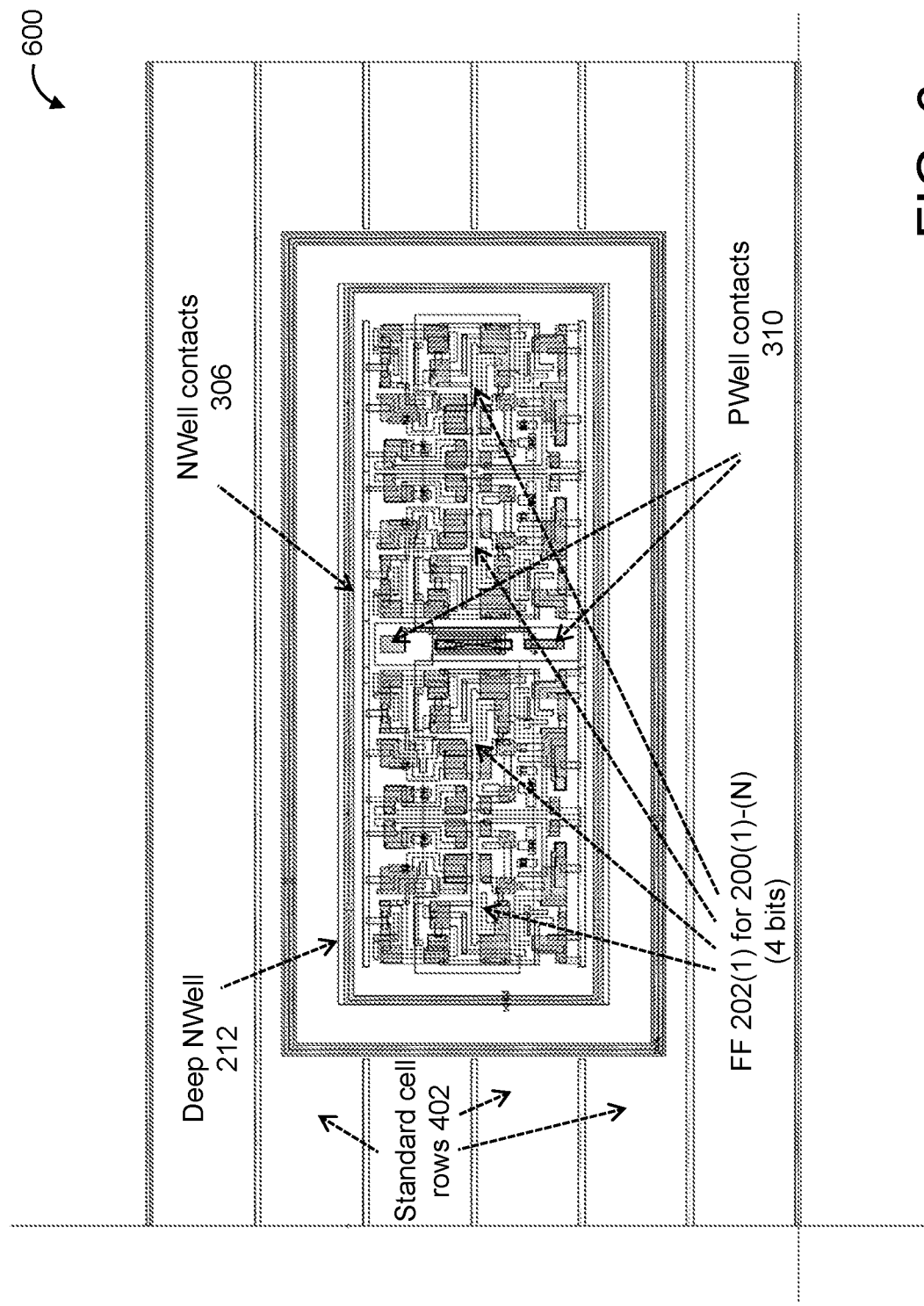
FIG. 6 illustrates an example circuitry component layout of an optimized multi-bit synchronizer, according to some embodiments of the present disclosure.

FIG. 6 shows a top-down view of an example circuitry component layout 600 of an optimized multi-bit synchronizer, which may be implemented using any of the embodiments described above. Layout 600 includes standard cell rows 402, which may use standard cells of a standard cell library to implement circuitry of the optimized multi-bit synchronizer, as discussed above.

The deep NWell 212 is incorporated within layout 600, where deep NWell 212 underlies both PWell 308 and NWell 304 in the embodiment shown. The area penalty of the deep NWell 212 can be seen as the spatial separation of the deep NWell 212 from the surrounding standard cell layout. However, multiple first FFs 202(1) are implemented within the PWell 308 and NWell 304 isolated by the deep NWell 212, which share the area penalty. In the example shown, first FF circuitry of a 4 bit synchronizer (e.g., N=4) is implemented within the deep NWell 212. Several NWell contacts 306 are visible in layout 400, which are connected to the first voltage Vbias1 that is equal to VDD minus a first forward biasing voltage VFWD1. Several PWell contacts 310 are also visible in layout 400, which are connected to the second voltage Vbias2 that is equal to VSS plus a second forward biasing voltage VFWD2. As noted above, the first and second forward biasing voltages need not be equal. Voltages Vbias1 and Vbias2 may be provided by additional power signal lines respectively connected to NWell contacts 306 and PWell contacts 310.

Figure 7:
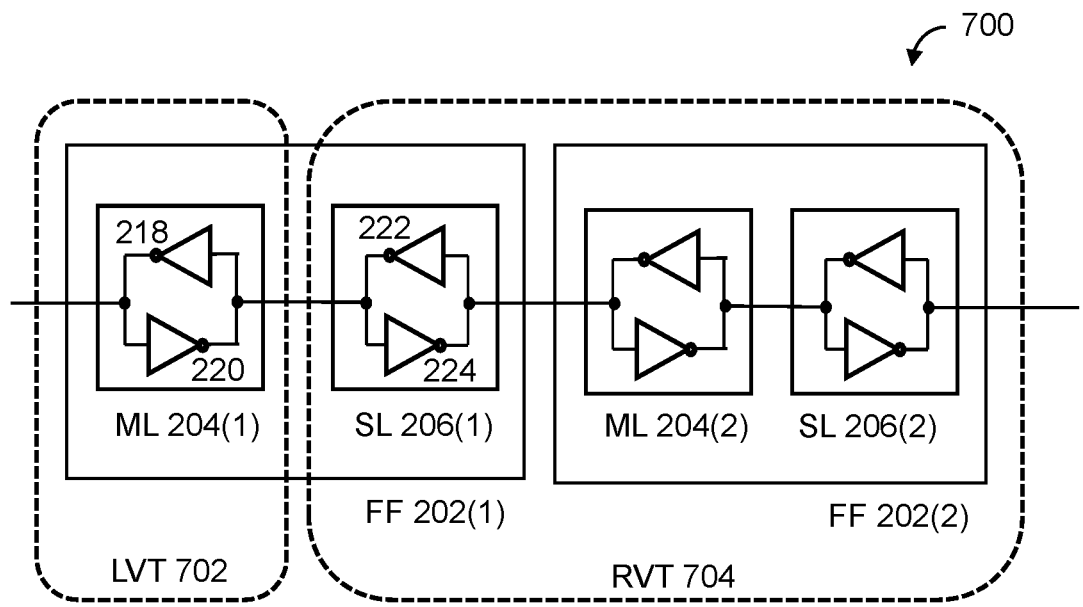
FIGS. 7 and 8 illustrate circuit schematics of other example optimized synchronizers implementing mixed threshold voltage technology, according to some embodiments of the present disclosure.

FIG. 7 is a circuit schematic showing another example optimized synchronizer 700 implemented with mixed voltage technology. Conventionally, flip-flop circuitry may be implemented using low voltage threshold (LVT) technology and minimal gate length values to reach lower Tau values. However, such LVT flip-flops have increased leakage power due to the lower threshold voltage Vt and the minimal gate lengths.

Synchronizer 700 is implemented with both LVT technology and regular voltage threshold (RVT) technology, which reduces Tau in the timing-critical first FF components of the synchronizer 700 while also reducing leakage power due to higher threshold voltage Vt and increased gate length values in the remaining components of the synchronizer 700 (as compared with an entire LVT implementation of the synchronizer). In the embodiment shown, synchronizer 700 implements the component structure similar to that shown in FIG. 2A, as discussed above, which includes first and second FFs 202(1)-(2) that are serially connected, where each includes a master latch 204 and a slave latch 206. Synchronizer 700 receives a data signal from a first clock domain, and outputs the data signal synchronized to a second clock domain, where the first and second clock domains do not use the same clock signal.

As discussed above, the circuitry of the FFs 202(1)-(2) may be implemented with transistors such as NMOS and PMOS transistors. The transistors may be formed using either LVT or RVT technology, each of which implement a different set of process steps to form the transistors on a substrate and achieve the desired threshold voltage Vt, which is the minimum gate-source voltage needed to create a conducting path between source and drain diffusion regions of the transistor (e.g., to turn on the transistor). The technologies may implement different gate width, lengths, and thicknesses, as well as different types of semiconductor materials (e.g., different gate oxide material) used to form the transistors, and different width, lengths, and thicknesses of the semiconductor materials (e.g., different gate oxide thicknesses) to achieve the desired threshold voltage. For example, the LVT technology may form a transistor having a threshold voltage of 0.7V or less (e.g., ultra-low threshold voltage may be less than 0.5V), while the RVT technology generally forms a transistor having a threshold voltage of 1V or more.

At least a portion of the circuitry of the first FF 202(1) is implemented using LVT technology 702 to reduce Tau. For example, in the embodiment shown, the master latch 204(1) of first FF 202(1) is implemented using LVT technology 702, while the slave latch 206(1) is implemented using RVT technology 704. The circuitry of the second FF 202(2) is also implemented using RVT technology 704. LVT technology 702 implements the master latch 204(1) using transistors that have both a low threshold voltage Vt and minimal gate length, while RVT technology 704 implements the remaining components of synchronizer 700 using transistors that have a high threshold voltage Vt and larger gate length (as compared with the LVT Vt and gate length). In this manner, the mixed voltage architecture of synchronizer 700 achieves a required Tau value (and corresponding MTBF value) without adding FF stages to the synchronizer or altering the circuit structure of the first FF itself.

Figure 8:
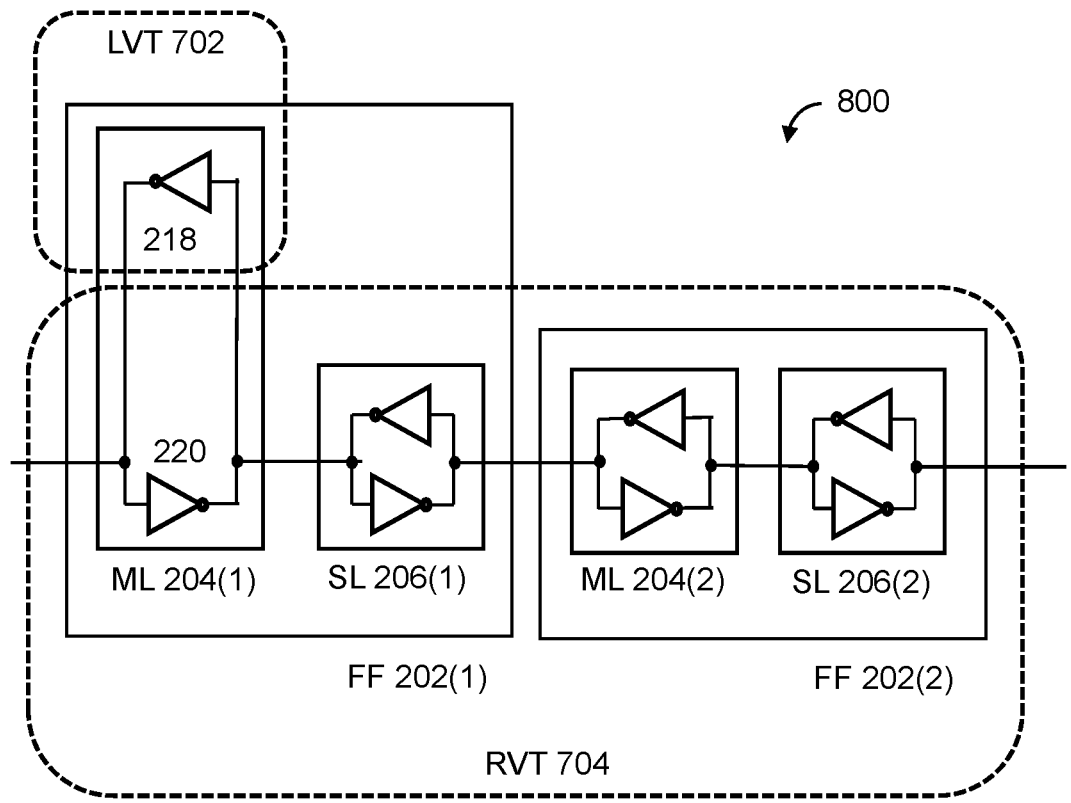

FIG. 8 shows another embodiment of an optimized synchronizer implemented with mixed voltage technology. Synchronizer 800 is similar to synchronizer 700, except that the first FF 202(1) shown in FIG. 7 is replaced with a first FF 202(1) that only has the feedback path of master latch 204(1) implemented with LVT technology, as represented by the feedback inverter 218. The feedback path is implemented using LVT transistors that have both a low Vt and minimal gate length. The remaining components of the synchronizer 800, including the slave latch 206(1) of the first FF 202(1) and the second FF 202(2), are implemented with RVT technology 704, which uses RVT transistors that have a high Vt and larger gate length (as compared with the LVT Vt and gate length).

A summary of the techniques and experimental values of Tau obtained using each technique are provided in Table 1 below. The first two example provided in Table 1 are conventional implementations of flip-flops, which are provided for the sake of comparison. The remaining 5 example synchronizers are implementations using the teachings provided herein, where each of the 5 synchronizers reach an MTBF of greater than 10 years. Examples A-D are implemented using the NWell/PWell forward biasing techniques described above for a single bit synchronizer (example A), a 4-bit synchronizer (example B), an 8-bit synchronizer (example C), and a 16-bit synchronizer (example D). It is noted that examples A-D are implemented using RVT technology, where the first FF circuitry in its entirety is included in forward biased NWell and PWell regions, each of which are biased using a forward biasing voltage of 0.4V, where the NWell is biased with VDD-0.4V and the PWell is biased with VSS+0.4V (as indicated by +/−0.4V in Table 1). Example E is a single bit synchronizer implemented using mixed VT technology, where the feedback path of the first FF is implemented using LVT transistors, and the remaining components of the synchronizer is implemented using RVT transistors.

A number of characteristics of the example synchronizers are provided for the sake of comparison, including the Tau value of the first FF in the respective synchronizer, the number of flip-flops in the respective synchronizer, the area per each separate synchronizer, and the total leakage current per each separate synchronizer. The parameters used to determine MTBF include Tw=100 ps, Fc=600 MHz, and Fd=300 MHz. The values provided below are examples only, given to achieve the MTBF of greater than 10 years, and are not intended to be limiting.

TABLE 1

Summary of Techniques and Experimental Results

|  | Tau of 1st FF (ps) | # of FF | Area per synchronizer (um^2) | Total leakage per synchronizer (uA) |
| --- | --- | --- | --- | --- |
| Standard (RVT) flip-flop | 364 | 9 | 36.3 | 7.5 |
| Conventional approaches to Tau optimized (RVT) flip-flop | 111 | 4 | 16.1 | 3.3 |
| Example A: Single-bit Isolated NWell/Pwell: 1st FF, NW/PW Forward-biasing: +/−0.4V | 45 | 2 | 68.5 | 2.3 |
| Example B: 4-bit Isolated NWell/Pwell: 1st FFs, NW/PW Forward-biasing: +/−0.4V | 45 | 2 | 25.2 | 2.3 |
| Example C: 8-bit Isolated NWell/Pwell: 1st FFs, NW/PW Forward-biasing: +/−0.4V | 45 | 2 | 19.3 | 2.3 |
| Example D: 16-bit | 45 | 2 | 15.2 | 2.3 |

TABLE 1-continued

Summary of Techniques and Experimental Results

|  | Tau of 1st FF (ps) | # of FF | Area per synchronizer (um^2) | Total leakage per synchronizer (uA) |
|---|---|---|---|---|
| Isolated NWell/Pwell: 1<sup>st</sup> FFs, NW/PW Forward-biasing: +/−0.4V Example E: Mixed VT Feedback of 1<sup>st</sup> flop implemented using LVT transistors, remaining using RVT transistors | 42 | 2 | 8.3 | 2.9 |

It is noted that each of the example synchronizers A-D achieves a decrease in Tau of approximately 2.5 times compared with conventional approaches to Tau optimized flip-flop (referred to below as conventional optimized FF), and approximately 8 times compared with standard flip-flops from a standard cell library (referred to below as a standard FF). Synchronizer example E achieves a greater decrease in Tau of approximately 2.6 times compared with conventional optimized FF, and 8.7 times compared with standard FF.

Examples A-D also show a decrease of approximately 40% in leakage current compared with conventional optimized FF, and approximately 3.3 times reduction compared with standard FF. Example E achieves a decrease of approximately 14% leakage compared with conventional optimized FF, and approximately 2.6 times compared with standard FF.

Examples A-D also show an area benefit may be achieved when multi-bit synchronizers are used, starting from about 8-bits (when the area per synchronizer becomes comparable with conventional optimized FF). Example E shows a 1.9 times area benefit in comparison with conventional optimized FF and a 4.4 times benefit in comparison with standard FF.

Examples A-E also achieve the MTBF of greater than 10 years while only using 2 FFs, which provides minimal latency for synchronization. It is also noted that the mixed voltage architecture may result in a wafer cost increase, due to the additional LVT masks needed with the conventional RVT mask implementation.

By now it should be appreciated that there has been provided embodiments of optimized synchronizer solutions that minimize probability of the metastability state, without increasing the number of stage in the synchronizer and without altering system requirements. In some embodiments, a synchronizer solution implements isolated NWell and PWell forward biasing of at least a portion of first FF circuitry, where the value of the forward biasing voltage may be adjusted, which in turn adjusts Tau to a desired value. In some embodiments, a synchronizer solution implements a mixed voltage architecture, where at least a portion of first FF circuitry is implemented using LVT technology, while the remaining circuitry of the synchronizer is implemented using RVT technology.

In one embodiment of the present disclosure, a synchronizer circuit having controllable metastability is provided, the synchronizer circuit including: a first flip-flop circuit including a first master latch connected in series with a first slave latch; and a second flip-flop circuit including a second master latch connected in series with a second slave latch, wherein an output of the first flip-flop circuit is connected to an input of the second flip-flop circuit, at least a portion of the first flip-flop circuit is implemented in a first PWell isolated by an underlying a deep isolation NWell, at least a portion of the first flip-flop circuit is implemented in a first NWell that electrically contacts the deep isolation NWell, the first NWell is connected to a first bias voltage that is less than a positive power supply voltage, and the first PWell is connected to a second bias voltage that is greater than a negative power supply voltage.

One aspect of the above embodiment provides that the first bias voltage is equal to the positive power supply voltage minus a first forward biasing voltage, and the second bias voltage is equal to the negative power supply voltage plus a second forward biasing voltage.

A further aspect of the above embodiment provides that the first and second forward biasing voltages have a same magnitude.

Another further aspect of the above embodiment provides that the first and second forward biasing voltages have different magnitudes.

Another aspect of the above embodiment provides that the synchronizer circuit is configured to adjust a Tau value of the first flip-flop circuit by adjusting a magnitude of one or both of the first and second forward biasing voltages.

Another aspect of the above embodiment provides that the deep isolation NWell extends underneath both the first NWell and the first PWell.

Another aspect of the above embodiment provides that the first master latch receives a data value from a first clock domain, the second slave latch outputs the data value synchronized with a second clock domain, and each of the first master latch, first slave latch, second master latch, and second slave latch receives one or more clock signals of the second clock domain.

Another aspect of the above embodiment provides that the second flip-flop circuit includes circuit components implemented in a second NWell and a second PWell laterally separated from the deep NWell and respectively distinct from the first NWell and the first PWell, the second NWell is biased with the positive power supply voltage, and the second PWell is biased with the negative power supply voltage.

Another aspect of the above embodiment provides that the first master latch and the first slave latch of the first flip-flop circuit are implemented within the first NWell and the first PWell.

Another aspect of the above embodiment provides that the first master latch of the first flip-flop circuit is implemented within the first NWell and the first PWell, and the first slave latch of the first flip-flop circuit is implemented within a second NWell and a second PWell laterally separated from the deep NWell and respectively distinct from the first NWell and the first PWell.

Another aspect of the above embodiment provides that the first master latch of the first flip-flop circuit includes an input path and a feedback path, the feedback path of the first master latch is implemented within the first NWell and the first PWell, and the input path of the first master latch is implemented within a second NWell and a second PWell laterally separated from the deep NWell and respectively distinct from the first NWell and the first PWell.

Another aspect of the above embodiment provides that the first flip-flop circuit connected in series with the second flip-flop circuit includes a bit synchronizer; and the synchronizer circuit further includes: a total of N bit synchronizers in parallel, N being an integer greater than 1, wherein each bit synchronizer receives a respective bit of an N-bit data value from a first clock domain and outputs a respective bit of the N-bit data value synchronized with a second clock domain, at least a portion of each first flip-flop circuit of the N bit synchronizers is implemented in the first PWell isolated by the underlying deep isolation NWell, and at least a portion of the first flip-flop circuit of the N bit synchronizers is implemented in the first NWell that electrically contacts that deep isolation NWell.

A further aspect of the above embodiment provides that the synchronizer circuit is configured to adjust a Tau value of each first flip-flop circuit of the N bit synchronizers by adjusting a magnitude of one or both of the first and second forward biasing voltages.

Another further aspect of the above embodiment provides that each first master latch and each first slave latch of each first flip-flop circuit of the N bit synchronizers are implemented within the first NWell and the first PWell.

Another further aspect of the above embodiment provides that each first master latch of each first flip-flop circuit of the N bit synchronizers are implemented within the first NWell and the first PWell, and each first slave latch of each first flip-flop circuit of the N bit synchronizers are implemented within a second NWell and a second PWell laterally separated from the deep NWell and respectively distinct from the first NWell and the first PWell.

Another further aspect of the above embodiment provides that each first master latch of each first flip-flop circuit of the N bit synchronizers includes an input path and a feedback path, each feedback path of each first master latch is implemented within the first NWell and the first PWell, and each input path of each first master latch is implemented within a second NWell and a second PWell laterally separated from the deep NWell and respectively distinct from the first NWell and the first PWell.

In another embodiment of the present disclosure, a synchronizer circuit having controllable metastability is provided, the synchronizer circuit including: a first flip-flop circuit including a first master latch connected in series with a first slave latch; and a second flip-flop circuit including a second master latch connected in series with a second slave latch, wherein an output of the first flip-flop circuit is connected to an input of the second flip-flop circuit, at least a portion of the first flip-flop circuit is implemented using low voltage threshold (LVT) technology, and a remaining portion of the first flip-flop circuit and an entirety of the second flip-flop circuit are implemented using regular voltage threshold (RVT) technology.

One aspect of the above embodiment provides that the portion of the first flip-flop circuit is implemented using transistors having a low voltage threshold according to the LVT technology, and the remaining portion of the first flip-flop circuit and the second flip-flop circuit are implemented using transistors having a high voltage threshold according to the RVT technology.

Another aspect of the above embodiment provides that the first master latch of the first flip-flop circuit is implemented using LVT technology, and the first slave latch of the first flip-flop circuit is implemented using RVT technology.

Another aspect of the above embodiment provides that the first master latch of the first flip-flop circuit includes an input path and a feedback path, the feedback path of the first master latch is implemented using LVT technology, and the input path of the first master latch is implemented using RVT technology.

Circuitry of any of the optimized synchronizers discussed herein may be implemented on a semiconductor substrate, which may be any semiconductor material or combinations of materials, such as gallium arsenide, silicon germanium, silicon-on-insulator (SOI), silicon, monocrystalline silicon, the like, and combinations of the above. The circuitry of synchronizer 200 is formed on the substrate using a sequence of numerous process steps applied to the substrate, including but not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like.

It will be appreciated that although MOSFET technology is commonly referred to as metal-oxide-semiconductor technology, the gates of such transistors are often made from a non-metallic conductive material, such as polysilicon, and their channels may be insulated by an insulator other than simple oxide.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

The following description refers to nodes or features being "connected" or "coupled" together. As used herein, unless expressly stated otherwise, "coupled" means that one node or feature is directly or indirectly joined to (or is in direct or indirect communication with) another node or feature, and not necessarily physically. As used herein, unless expressly stated otherwise, "connected" means that one node or feature is directly joined to (or is in direct communication with) another node of feature. For example, a switch may be "coupled to a plurality of nodes, but all of those nodes need not always be "connected" to each other; the switch may connect different nodes to each other depending upon the state of the switch. Furthermore, although the various schematics shown herein depict certain example arrangements of elements, additional intervening elements, devices, features, or components may be present in an actual embodiment (assuming that the functionality of the given circuit is not adversely affected).

As used herein, the terms "substantial" and "substantially" mean sufficient to achieve the stated purpose or value in a practical manner, taking into account any minor imperfections or deviations, if any, that arise from usual and expected process abnormalities that may occur during wafer fabrication, which are not significant for the stated purpose or value. Also as used herein, the terms "approximately" or "approximating" mean a value close to or within an acceptable range of an indicated value, amount, or quality, which also includes the exact indicated value itself.

Although the invention is described herein with reference to specific embodiments, various modifications and changes can be made without departing from the scope of the present invention as set forth in the claims below. For example, additional one-bit synchronizers may be implemented in FIG. 2B. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A synchronizer circuit having controllable metastability, the synchronizer circuit comprising:
a first flip-flop circuit comprising a first master latch connected in series with a first slave latch; and
a second flip-flop circuit comprising a second master latch connected in series with a second slave latch, wherein an output of the first flip-flop circuit is connected to an input of the second flip-flop circuit,
at least a portion of the first flip-flop circuit is implemented in a first PWell isolated by an underlying a deep isolation NWell,
at least a portion of the first flip-flop circuit is implemented in a first NWell that electrically contacts the deep isolation NWell,
the first NWell is connected to a first bias voltage that is less than a positive power supply voltage, and
the first PWell is connected to a second bias voltage that is greater than a negative power supply voltage.

2. The synchronizer circuit of claim 1, wherein
the first bias voltage is equal to the positive power supply voltage minus a first forward biasing voltage, and
the second bias voltage is equal to the negative power supply voltage plus a second forward biasing voltage.

3. The synchronizer circuit of claim 2, wherein
the first and second forward biasing voltages have a same magnitude.

4. The synchronizer circuit of claim 2, wherein
the first and second forward biasing voltages have different magnitudes.

5. The synchronizer circuit of claim 1, wherein
the synchronizer circuit is configured to adjust a Tau value of the first flip-flop circuit by adjusting a magnitude of one or both of the first and second forward biasing voltages.

6. The synchronizer circuit of claim 1, wherein
the deep isolation NWell extends underneath both the first NWell and the first PWell.

7. The synchronizer circuit of claim 1, wherein
the first master latch receives a data value from a first clock domain,
the second slave latch outputs the data value synchronized with a second clock domain, and
each of the first master latch, first slave latch, second master latch, and second slave latch receives one or more clock signals of the second clock domain.

8. The synchronizer circuit of claim 1, wherein
the second flip-flop circuit comprises circuit components implemented in a second NWell and a second PWell laterally separated from the deep NWell and respectively distinct from the first NWell and the first PWell,
the second NWell is biased with the positive power supply voltage, and
the second PWell is biased with the negative power supply voltage.

9. The synchronizer circuit of claim 1, wherein
the first master latch and the first slave latch of the first flip-flop circuit are implemented within the first NWell and the first PWell.

10. The synchronizer circuit of claim 1, wherein
the first master latch of the first flip-flop circuit is implemented within the first NWell and the first PWell, and
the first slave latch of the first flip-flop circuit is implemented within a second NWell and a second PWell laterally separated from the deep NWell and respectively distinct from the first NWell and the first PWell.

11. The synchronizer circuit of claim 1, wherein
the first master latch of the first flip-flop circuit comprises an input path and a feedback path,
the feedback path of the first master latch is implemented within the first NWell and the first PWell, and
the input path of the first master latch is implemented within a second NWell and a second PWell laterally separated from the deep NWell and respectively distinct from the first NWell and the first PWell.

12. The synchronizer circuit of claim 1, wherein
the first flip-flop circuit connected in series with the second flip-flop circuit comprises a bit synchronizer; and
the synchronizer circuit further comprises:
a total of N bit synchronizers in parallel, N being an integer greater than 1, wherein each bit synchronizer receives a respective bit of an N-bit data value from a first clock domain and outputs a respective bit of the N-bit data value synchronized with a second clock domain, at least a portion of each first flip-flop circuit of the N bit synchronizers is implemented in the first PWell isolated by the underlying deep isolation NWell, and at least a portion of the first flip-flop circuit of the N bit synchronizers is implemented in the first NWell that electrically contacts that deep isolation NWell.

13. The synchronizer circuit of claim 12, wherein
the synchronizer circuit is configured to adjust a Tau value of each first flip-flop circuit of the N bit synchronizers by adjusting a magnitude of one or both of the first and second forward biasing voltages.

14. The synchronizer circuit of claim 12, wherein
each first master latch and each first slave latch of each first flip-flop circuit of the N bit synchronizers are implemented within the first NWell and the first PWell.

15. The synchronizer circuit of claim 12, wherein
each first master latch of each first flip-flop circuit of the N bit synchronizers are implemented within the first NWell and the first PWell, and each first slave latch of each first flip-flop circuit of the N bit synchronizers are implemented within a second NWell and a second PWell laterally separated from the deep NWell and respectively distinct from the first NWell and the first PWell.

16. The synchronizer circuit of claim 12, wherein
each first master latch of each first flip-flop circuit of the N bit synchronizers comprises an input path and a feedback path, each feedback path of each first master latch is implemented within the first NWell and the first PWell, and each input path of each first master latch is implemented within a second NWell and a second PWell laterally separated from the deep NWell and respectively distinct from the first NWell and the first PWell.

17. A synchronizer circuit having controllable metastability, the synchronizer circuit comprising:

a first flip-flop circuit comprising a first master latch connected in series with a first slave latch; and a second flip-flop circuit comprising a second master latch connected in series with a second slave latch, wherein an output of the first flip-flop circuit is connected to an input of the second flip-flop circuit, at least a portion of the first flip-flop circuit is implemented using low voltage threshold (LVT) technology, and a remaining portion of the first flip-flop circuit and an entirety of the second flip-flop circuit are implemented using regular voltage threshold (RVT) technology;

wherein
the first master latch of the first flip-flop circuit is implemented using LVT technology, and the first slave latch of the first flip-flop circuit is implemented using RVT technology.

18. The synchronizer circuit of claim 17, wherein
the portion of the first flip-flop circuit is implemented using transistors having a low voltage threshold according to the LVT technology, and the remaining portion of the first flip-flop circuit and the second flip-flop circuit are implemented using transistors having a high voltage threshold according to the RVT technology.

19. A synchronizer circuit having controllable metastability, the synchronizer circuit comprising:

a first flip-flop circuit comprising a first master latch connected in series with a first slave latch; and a second flip-flop circuit comprising a second master latch connected in series with a second slave latch, wherein an output of the first flip-flop circuit is connected to an input of the second flip-flop circuit, at least a portion of the first flip-flop circuit is implemented using low voltage threshold (LVT) technology, and a remaining portion of the first flip-flop circuit and an entirety of the second flip-flop circuit are implemented using regular voltage threshold (RVT) technology;

wherein:
the first master latch of the first flip-flop circuit comprises an input path and a feedback path, the feedback path of the first master latch is implemented using LVT technology, and the input path of the first master latch is implemented using RVT technology.

20. The synchronizer circuit of claim 19, wherein
the portion of the first flip-flop circuit is implemented using transistors having a low voltage threshold according to the LVT technology, and the remaining portion of the first flip-flop circuit and the second flip-flop circuit are implemented using transistors having a high voltage threshold according to the RVT technology.

* * * * *